United States Patent [19]

Roullet et al.

[11] 4,399,566
[45] Aug. 16, 1983

[54] DEVICE FOR STABILIZING THE OUTPUT POWER OF A TRANSMITTER MODULE IN AN OPTICAL FIBER TRANSMISSION SYSTEM

[75] Inventors: Gerald Roullet; Jean-Paul Breton; Adalbert Maciaszek, all of Paris, France

[73] Assignee: Lignes Telegraphiques et Telephoniques, Conflans Ste Honorine, France

[21] Appl. No.: 320,229

[22] Filed: Nov. 12, 1981

[30] Foreign Application Priority Data

Nov. 14, 1980 [FR] France ............... 80 24230

[51] Int. Cl.³ ............................................. H04B 9/00
[52] U.S. Cl. ................................. 455/613; 455/611; 455/618; 332/7.51
[58] Field of Search ............... 455/608, 611, 613, 618; 307/311, 312, 297; 332/7.51

[56] References Cited

U.S. PATENT DOCUMENTS 4,277,846 7/1981 Chen ................................. 455/611
4,307,469 12/1981 Casper et al. ..................... 455/618

FOREIGN PATENT DOCUMENTS 2730056 1/1979 Fed. Rep. of Germany ...... 455/618
2448274 2/1979 France .
1539624 1/1979 United Kingdom .

OTHER PUBLICATIONS

2eme Colloque Europeen sur les Transmission par Fibres Optiques, Paris, Sep. 27-30, 1976, Tour Olivier de Serres, R. E. Epsworth: "Sous-Ensembles pour Liasons optiques a Grande Vitesse", pp. 377-382.
5th European Conference on Optical Communication, Sep. 17-19, 1979, Amsterdam, E. Duda: "Semiconductor Laser Transmitter for Optical Communication Systems", pp. 13-5-1 to 13-5-4.
IEEE Transactions on Communications, vol. COM-26, Jul. 1978, No. 7, New York, J. Gruber et al.: "Electronic Circuits for High Bit Rate Digital Fiber Optic Communication Systems", pp. 1088-1098.
Electronics Letters, vol. 16, No. 1, Jan. 1980 London, F. S. Chen: "Simultaneous Feedback Control of Bias and Modulation Currents for Injection Lasers", pp. 7-8.
Wireless World, vol. 82, No. 1492, Dec. 1976, London, M. Ramsay et al.: "Optical Fiber Communication-2", pp. 67-70.

Primary Examiner—John C. Martin
Assistant Examiner—Edward L. Coles
Attorney, Agent, or Firm—Oblon, Fisher, Spivak, McClelland & Maier

[57] ABSTRACT

A device for stabilizing the output power of a transmitter module in an optical fiber transmission system comprises a first circuit for stabilizing the mean value of the optical output power produced by a laser diode, the first circuit being connected between a device for converting optical power to electrical power and the laser diode. The device further comprises a second circuit for stablilizing the amplitude of modulation of the optical output power produced by the laser diode, the second circuit being connected between the conversion circuit and the laser diode.

6 Claims, 1 Drawing Figure

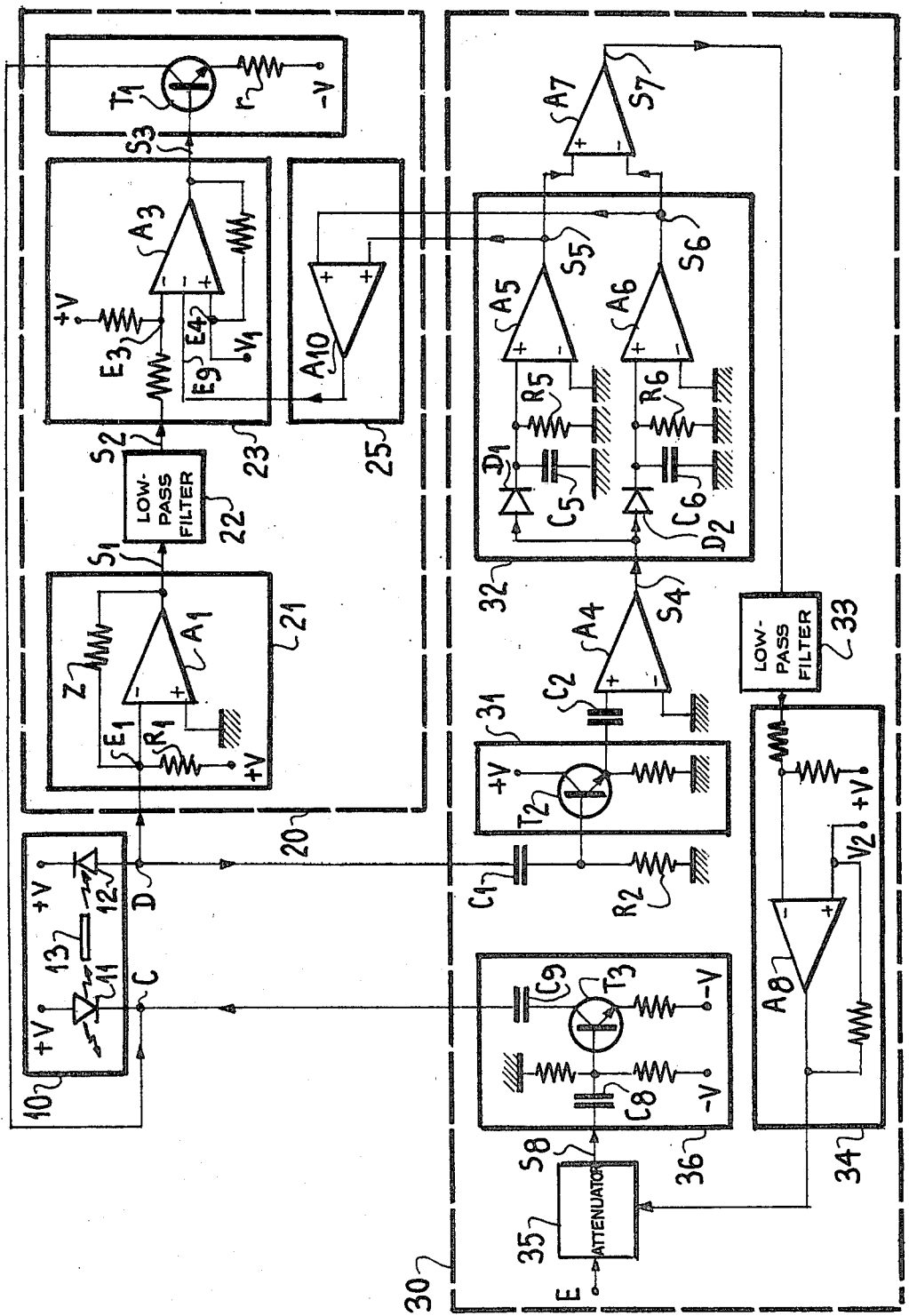

DEVICE FOR STABILIZING THE OUTPUT POWER OF A TRANSMITTER MODULE IN AN OPTICAL FIBER TRANSMISSION SYSTEM

BACKGROUND OF THE INVENTION

This invention generally relates to optical fiber transmission systems and is more particularly concerned with a device for stabilizing the optical output power of the transmitter module in a data transmission system, especially a system having a high bit stream rate of the order of 140 Mbits/s, for example.

It can be stated in general terms that, in an optical fiber transmission system, the transmitter module comprises a transmitter base consisting of a laser diode, a control photodiode and a laser-fiber optical coupling system inserted in a plug for connecting said base to the optical fiber cable, and a control electronic system for performing, among other functions, the regulation or stabilization of the optical power output.

It is also known that, in the presence of data to be transmitted, the current of the laser diode employed in the transmitter module results from superposition of its d.c. bias current and its modulation current, with the result that the amplitude of the light pulses transmitted through the optical fiber depends on the optical output power produced by the laser diode. Since it is desired to transmit the light pulses at the maximum output power of the laser diode, it proves necessary to stabilize both the maximum optical power and the minimum optical power in order to maintain the amplitude of the optical output power of the laser diode at a constant value. This stabilization is obtained by regulating the modulation current of the laser diode. Furthermore, when a temperature variation of the casing which contains the laser diode takes place, the transfer characteristic of the laser diode (output power as a function of current intensity) is modified, with the result that a temperature-dependent regulation of the laser diode d.c. bias current permits detection of aging of the laser diode which is identical within the range of operating temperatures.

In the case of a high bit-rate data transmission system, it is already possible by means of a known device to stabilize the optical power output of the laser diode employed in the transmitter module. A device of this type is described in the article published in "I.E.E.E. Transactions on Communications", vol. 26, No. 7, July 1978, pages 1088 to 1097 and entitled "Electronic Circuits for High Bit Rate Digital Fiber Optic Communication Systems". In FIG. 8 of this article, the device for stabilizing the optical output power produced by the laser diode consists of a first control loop comprising a modulating-signal peak-to-peak amplitude detector in series with a differentiator for stabilizing the maximum optical output power and the minimum optical output power produced by the laser diode, thus maintaining the amplitude of modulation of the optical output power at a constant value, and a second control loop comprising a d.c. amplifier in series with a differentiator for stabilizing the laser diode d.c. bias voltage corresponding to the minimum optical output power produced by said diode.

However, a device of this type for stabilizing the optical output power of a laser diode is subject to disadvantages. In fact, when digital data are not present, it is necessary to put both control loops out of service at the same time. Furthermore, by reason of stabilization of the laser diode bias voltage at a value corresponding to the minimum optical output power produced by said diode, said device is capable of transmitting neither analog data nor data in multilevel codes. Moreover, the structure of this device is relatively complex.

SUMMARY OF THE INVENTION

The aim of the present invention is to overcome these disadvantages by proposing a device for stabilizing the optical output power produced by a laser diode, said device being of very simple structural design while ensuring correct operation of the laser diode (absence of overcurrents, and absence of any stimulated emission delay) and also permitting fabrication in the form of a hybrid circuit, thus reducing the cost of construction of said device to an appreciable degree.

In accordance with the invention, stabilization of the optical output power produced by the laser diode consists on the one hand in stabilizing the amplitude of modulation of the optical output power produced by said diode and on the other hand in stabilizing the mean value of the optical output power corresponding to the d.c. bias voltage of said diode. Said stabilization of the laser diode bias at the mean value of optical power makes it possible for the device to transmit indifferently either digital data, analog data or data in the form of multi-level codes.

To this end, the invention is directed to a device which serves to stabilize the output power of a transmitter module in a data transmission system which utilizes an optical fiber and comprising:

- a unit in which are disposed a laser diode, means for taking a part of the optical output power produced by the laser diode and for converting optical power to electrical power;
- a first circuit for stabilizing the mean value of the optical output power produced by the laser diode, said circuit being connected between the conversion means and said laser diode and provided with first voltage comparator means adapted to produce a stabilized laser-diode d.c. bias voltage corresponding to the mean value of the optical output power produced by the laser diode;
- a second circuit for stabilizing the amplitude of modulation of the optical output power produced by the laser diode, said circuit being connected between the conversion means and the laser diode and provided with means for detecting the peak-to-peak amplitude of the laser-diode modulating signal and means for differentiating the signals generated by the peak-to-peak detection means so as to deliver a laser-diode modulating signal having a stabilized peak-to-peak amplitude corresponding to the difference between the maximum optical output power and the minimum optical output power produced by the laser diode.

The essential feature of the invention lies in the fact that the first circuit for stabilizing the mean value of the optical output power produced by the laser diode is further provided with means for restituting the low-frequency component of the signal to be transmitted, said restituting means being connected between the output of the peak-to-peak detection means and the input of the first voltage comparator means, thus permitting stabilization of the minimum and maximum values of optical output power produced by the laser diode.

BRIEF DESCRIPTION OF THE DRAWING

Other features and advantages of the invention will be more apparent upon consideration of the following description, reference being made to the single accompanying FIGURE in which the transmitter module equipped with the power-stabilizing device in accordance with the invention is illustrated partly in the form of an electrical diagram.

DESCRIPTION OF THE INVENTION

A first point to be noted is that all the supply voltages designated by the reference V in the drawing are of the order of 12 volts.

In one example of construction illustrated in the accompanying drawing, the transmitter module of a system for transmission of data along an optical fiber, especially a system having a high bit stream rate equal to 140 Mbits/s, for example, comprises a unit 10 designed in the form of a casing in which are placed a laser diode 11, the optical output power of which is injected into the fiber (not shown), means for taking a part of the optical output power produced by the laser diode and converting to electrical power. By way of example, said means can consist of a photodiode 12 and a coupling fiber 13 between the laser diode 11 and the photodiode 12.

In accordance with the invention, the device for stabilizing the optical output power of the laser diode 11 employed in the transmitter module comprises a first circuit 20 for stabilizing the mean value of the optical power produced by said diode, said circuit being connected between the photodiode 12 and the laser diode 11. The device further comprises a second circuit 30 connected between the photodiode 12 and the laser diode 11 for stabilizing the maximum optical output power and the minimum optical output power of said diode, which corresponds to stabilization of the amplitude of modulation of the optical output power.

As clearly shown in the FIGURE, the first circuit 20 for stabilizing the mean value of the optical power emitted by the laser diode 11 comprises a current-voltage converter 21 constituted by an operational amplifier $A_1$ mounted as a transimpedance, one input $E_1$ of which is connected to the photodiode 12. The reference Z represents the negative feedback impedance connected between the output $S_1$ and the input $E_1$ of the operational amplifier $A_1$ and the reference $R_1$ represents the load resistor of said amplifier. Thus the current generated by the photodiode 12 in proportion to the optical output power produced by the laser diode 11 is converted to a voltage by the amplifier $A_1$ which is mounted as a transimpedance. The output signal $S_1$ is then integrated by a low-pass filter 22 of conventional structure which is connected in series with the current-voltage converter 21. The low-pass filter 22 delivers at its output $S_2$ a d.c. voltage which is proportional to the mean optical power output of the laser diode 11. This voltage is then presented to a voltage comparator circuit 23 constituted by an operational amplifier $A_3$ having a first input $E_3$ connected to the output of the low-pass filter 22, and a second input $E_4$ connected to a reference voltage source $V_1$ corresponding to the mean optical output power of the laser diode 11. The precise function of the voltage comparator 23 will be explained hereinafter. It will be noted at the present juncture that the voltage comparator 23 delivers at the output $S_3$ a voltage which is intended to bias the laser diode 11 at its mean optical power. To this end, said voltage drives the base of a transistor $T_1$ for biasing the laser diode 11, the collector of the transistor $T_1$ being connected to the laser diode 11 at C, and a resistor r being connected to the emitter of said transistor in order to limit the injected current.

As is apparent from the FIGURE, the second circuit 30 for stabilizing the amplitude of modulation of the optical output power produced by the laser diode 11 comprises an impedance-matching circuit 31 constituted by a transistor $T_2$, the base of which is connected to the photodiode 12 at D via a resistor $R_2$ and a capacitor $C_1$. The emitter of the transistor $T_2$ is connected via a capacitor $C_2$ to the input of an operational amplifier $A_4$, the output $S_4$ of which is connected to a peak-to-peak detector 32. Said peak-to-peak detector 32 comprises two parallel diodes $D_1$ and $D_2$ each connected to an operational amplifier having a high input impedance ($A_5$ and $A_6$) via a capacitor and a resistor mounted in parallel ($C_5$, $R_5$ and $C_6$, $R_6$). The respective outputs $S_5$ and $S_6$ of the two amplifiers $A_5$ and $A_6$ are connected directly to the input of a differentiating amplifier $A_7$.

Thus the a.c. component of the current generated by the photodiode 12 is filtered via the capacitor $C_1$ and the load resistor $R_2$, then amplified after passing through the impedance-matching circuit 31 via the amplifier $A_4$, the function of which is to bring the amplitude of the modulating signal to a value which is compatible with the threshold of the diodes $D_1$ and $D_2$ of the peak-to-peak detector 32.

The diode $D_1$ and the capacitor $C_5$ detect the peak or positive amplitude of the modulating signal which is present at $S_4$, and the diode $D_2$ and the capacitor $C_6$ detect the peak or negative amplitude of said modulating signal. The amplifier $A_5$ delivers at the output $S_5$ the positive amplitude of the modulating signal which is proportional to the maximum optical output power produced by the laser diode 11. The amplifier $A_6$ delivers at the output $S_6$ the negative amplitude of the modulating signal which is proportional to the minimum optical output power of the laser diode 11. These positive and negative voltages are then applied to the differentiating amplifier $A_7$ and this latter generates at $S_7$ a voltage which is proportional to the peak-to-peak amplitude of the modulating signal. This voltage is then integrated by a low-pass filter 33 of conventional structure, then applied to a voltage comparator circuit 34 constituted by an operational amplifier $A_8$ in which said voltage is compared with a reference voltage $V_2$. The error voltage produced by the voltage comparator 34 controls a variable attenuator 35 of conventional structure and this latter receives the data which are to be transmitted and are present at an input terminal E. The output $S_8$ of the attenuator 35 is connected to a current amplifier 36 consisting of a transistor $T_3$, the base of which is connected to said output $S_8$ via a capacitor $C_8$ and the collector of which is connected to the laser diode 11 at C via a capacitor $C_9$. Thus the variable attenuator 35 produces action on the amplitude of the modulating current generated by the transistor $T_3$, thus ensuring stabilization of the amplitude of modulation of the optical output power produced by the laser diode 11.

By virtue of the presence of the decoupling capacitors ($C_1$, $C_2$, $C_9$), the values of which must not be too high to permit both hybridization of the system and transmission of data at high bit rates, the device for stabilizing the optical output power described in the foregoing is limited at low frequencies. For example in the case of data such as digital data transmitted at high bit rates, the following phenomenon is observed as a consequence.

In the first place, when there is a preponderance of logic states "1", the laser diode is no longer biased above the threshold value in the case of the logic states "0". This gives rise to the well-known phenomenon of delay in stimulated emission of the laser diode.

Secondly, when there is a preponderance of logic states "0", the current injected into the laser diode and corresponding to the logic states "1" is too high and results in degradation of said laser diode.

With a view to overcoming these difficulties and restituting the low-frequency component of the spectrum of the signal to be transmitted, said low-frequency component being filtered by the capacitors mentioned in the foregoing, the first circuit 20 for stabilizing the mean value of optical output power produced by the laser diode 11 also comprises means 25 for restituting the low-frequency component of the signal to be transmitted, said means being connected between the peak-to-peak detector 32 and the voltage comparator circuit 23. More specifically, said restitution means 25 are constituted by an operational amplifier $A_{10}$ mounted as a summing circuit having two inputs connected respectively to the outputs $S_5$ and $S_6$ of the two amplifiers $A_5$ and $A_6$ of the peak-to-peak detector, and an output connected to an input $E_9$ of the amplifier $A_3$ of the voltage comparator circuit 23. Said summing amplifier $A_{10}$ constitutes means for restoring the low-frequency component of the signal to be transmitted, said means being intended to stabilize the minimum and maximum values of optical power output produced by said laser diode.

The two voltages which are present respectively at the outputs $S_5$ and $S_6$ of the two amplifiers $A_5$ and $A_6$, and which correspond to the respective positive and negative amplitudes of the modulating signal are summated by the operational amplifier $A_{10}$. Said amplifier $A_{10}$ generates a signal which is proportional to the low-frequency component of the signal to be transmitted. Said signal is then applied to the input $E_9$ of the amplifier $A_3$ and is superimposed on the bias signal which is present at the input $E_3$ of said amplifier $A_3$. From this moment onwards, the transistor $T_1$ produces via its collector the bias current which is superimposed on a current whose amplitude is proportional to the low-frequency component of the signal to be transmitted, thus making it possible to obtain stabilization of the minimum and maximum values of optical output power produced by the laser diode 11.

In order to obtain correct operation of the device described in the foregoing, two conditions must be satisfied:
- the cutoff frequency related to the capacitor $C_9$ must be higher than the cutoff frequency associated with the capacitors $C_5$ and $C_6$;
- the cutoff frequency of the device, namely the frequency imposed by the resistors $R_5.C_5$ or $R_6.C_6$, must be higher than the respective cutoff frequencies of the low-pass filters 22 and 33.

It will be noted that, when no data are present at the input E of the transmitter module, the circuit 30 for stabilizing the amplitude of modulation of the optical power must alone be put out of service.

As described in the foregoing, the device in accordance with the invention for stabilizing the optical output power produced by a laser diode and for restituting the low-frequency component of the spectrum of the signal to be transmitted is of particularly simple design, highly efficient, and advantageous from the point of view of fabrication costs.

What is claimed is:

1. A device for stabilizing the output power of a transmitter module in a data transmission system which utilizes an optical fiber and comprising:
   a unit in which are disposed a laser diode, means for taking a part of the optical output power produced by the laser diode and for converting optical power to electrical power;
   a first circuit for stabilizing the mean value of the optical output power produced by said laser diode, said circuit being connected between said conversion means and said laser diode and provided with first voltage comparator means adapted to produce a laser-diode d.c. bias voltage corresponding to the mean value of the optical output power produced by said laser diode;
   a second circuit for stabilizing the amplitude of modulation of the optical output power produced by said laser diode, said circuit being connected between said conversion means and said laser diode and provided with means for detecting the peak-to-peak amplitude of the laser-diode modulating signal and means for differentiating the signals generated by said peak-to-peak detection means so as to deliver a laser-diode modulating signal having a stabilized peak-to-peak amplitude corresponding to the difference between the maximum optical output power and the minimum optical output power produced by the laser diode,
   wherein said first circuit for stabilizing the mean value of the optical output power produced by the laser diode is further provided with means for restituting the low-frequency component of the signal to be transmitted, said restituting means being connected between the output of said peak-to-peak detection means and the input of said first voltage comparator means, thus permitting stabilization of the minimum and maximum values of optical output power produced by said laser diode.

2. A device according to claim 1, wherein said restitution means comprise means for summing the signals generated by said peak-to-peak detection means, there being delivered at the output of said restitution means a voltage having a value which ensures restitution of the low-frequency component of the signal to be transmitted and thus permits stabilization of the minimum and maximum values of the optical output power produced by the laser diode.

3. A device according to claim 1, wherein said peak-to-peak detection means comprise two diodes in parallel each connected to the input of an amplifier having a high input impedance, the output of each amplifier being connected to said differentiation means and to said restitution means.

4. A device according to claim 1, wherein said second circuit for stabilizing the amplitude of modulation of the optical output power produced by the laser diode further comprises:
   impedance-matching means connected between said conversion means and the input of said peak-to-peak detection means;
   a first low-pass filter connected to the output of said differentiating means;

second voltage comparator means connected to the output of said first low-pass filter;

a current amplifier controlled by the data to be transmitted and connected in series between said second voltage comparator means and the laser diode.

5. A device according to claim 4, wherein said second circuit for stabilizing the amplitude of modulation of the optical output power produced by the laser diode further comprises a variable attenuator connected between said second voltage comparator means and said current amplifier, said variable attenuator being provided with an input terminal for receiving the data to be transmitted.

6. A device according to claim 1, wherein said first circuit for stabilizing the mean value of the optical output power produced by the laser diode further comprises in series:

an operational amplifier mounted as a transimpedance whose input is connected to said conversion means;

a second low-pass filter whose output is connected to said first voltage comparator means.

* * * * *